(12) United States Patent
Rauch

(10) Patent No.: US 11,541,421 B2
(45) Date of Patent: Jan. 3, 2023

(54) ELEMENT WEARABLE ON THE BODY AND USE OF THE ELEMENT WEARABLE ON THE BODY

(71) Applicant: TDK Electronics AG, Munich (DE)

(72) Inventor: Wolfgang Rauch, Deutschlandsberg (AT)

(73) Assignee: TDK ELECTRONICS AG, Munich (DE)

( * ) Notice: Subject to any disclaimer, the term of this patent is extended or adjusted under 35 U.S.C. 154(b) by 778 days.

(21) Appl. No.: 16/494,251

(22) PCT Filed: Mar. 13, 2018

(86) PCT No.: PCT/EP2018/056224
§ 371 (c)(1),
(2) Date: Sep. 13, 2019

(87) PCT Pub. No.: WO2018/167053
PCT Pub. Date: Sep. 20, 2018

(65) Prior Publication Data
US 2020/0130011 A1    Apr. 30, 2020

(30) Foreign Application Priority Data

Mar. 15, 2017   (DE) .......................... 102017105529.0

(51) Int. Cl.
*B06B 1/06*   (2006.01)
*B06B 1/02*   (2006.01)
(Continued)

(52) U.S. Cl.
CPC .......... *B06B 1/0269* (2013.01); *H01L 41/083* (2013.01); *H01L 41/09* (2013.01); *H04R 17/00* (2013.01); *H04R 2201/023* (2013.01)

(58) Field of Classification Search
CPC ... H01L 41/083; H01L 41/09; B06B 1/06145; B06B 1/0607; B06B 1/06; B06B 1/0269; H04R 17/00
See application file for complete search history.

(56) References Cited

U.S. PATENT DOCUMENTS 5,986,813 A * 11/1999 Saikawa ............... G02B 27/017
                                                      359/630
7,368,855 B2    5/2008 Orten
(Continued)

FOREIGN PATENT DOCUMENTS

CN    1646887 A    7/2005
CN  102068336 A    5/2011
(Continued)

OTHER PUBLICATIONS

Coroflot, "Music for Deaf People," Frederik Podzuweit, retrieved on Sep. 4, 2019 from https://www.coroflot.com/frederik/music-for-deaf-people, 7 pages.
(Continued)

*Primary Examiner* — J. San Martin
(74) *Attorney, Agent, or Firm* — Slater Matsil, LLP

(57) ABSTRACT

A wearable element is disclosed. In an embodiment a wearable element includes at least one piezoelectric element configured to vibrate so that a haptic impression of an acoustic signal is generated, wherein the wearable element is wearable on a body.

21 Claims, 2 Drawing Sheets

(51) Int. Cl.
*H01L 41/083* (2006.01)
*H01L 41/09* (2006.01)
*H04R 17/00* (2006.01)

(56) References Cited

U.S. PATENT DOCUMENTS

| | | | |
|---|---|---|---|
| 2004/0114777 A1* | 6/2004 | Aubauer | H04R 5/023 |
| | | | 381/301 |
| 2009/0245553 A1 | 10/2009 | Parker | |
| 2010/0141407 A1 | 6/2010 | Heubel et al. | |
| 2010/0172216 A1 | 7/2010 | Liu et al. | |
| 2011/0137166 A1* | 6/2011 | Klee | A61B 8/4281 |
| | | | 600/437 |
| 2014/0070957 A1 | 3/2014 | Longinotti-Buitoni et al. | |
| 2015/0371510 A1* | 12/2015 | Nakamura | G06F 3/014 |
| | | | 340/407.1 |
| 2016/0088380 A1 | 3/2016 | Stauber et al. | |
| 2016/0279021 A1* | 9/2016 | Hyde | A61H 23/0245 |
| 2018/0160209 A1* | 6/2018 | Ogata | H04R 1/288 |
| 2020/0130011 A1 | 4/2020 | Rauch | |

FOREIGN PATENT DOCUMENTS

| | | | | |
|---|---|---|---|---|
| CN | 102123666 | A | 7/2011 | |
| CN | 109100056 | A * | 12/2018 | ............... G01L 1/16 |
| DE | 202005004255 | U1 | 10/2005 | |
| EP | 3018825 | A1 * | 5/2016 | |
| JP | H06338640 | A | 12/1994 | |
| JP | H1065996 | A | 3/1998 | |
| JP | 2004508695 | A | 3/2004 | |
| WO | 9627358 | A1 | 9/1996 | |
| WO | 02062096 | A2 | 8/2002 | |
| WO | 2016046810 | A2 | 3/2016 | |
| WO | 2018167053 | A | 9/2018 | |

OTHER PUBLICATIONS

"DAS Sound Shirt," Junge Symphoniker Hamburg, Enabling Deaf People to feel classical music—sound shirt, downloaded on Sep. 4, 2019 from https://sound-shirt.jimdo.com/english-1/, 5 pages.

* cited by examiner

US 11,541,421 B2

ELEMENT WEARABLE ON THE BODY AND USE OF THE ELEMENT WEARABLE ON THE BODY

This patent application is a national phase filing under section 371 of PCT/EP2018/056224, filed Mar. 13, 2018, which claims the priority of German patent application 102017105529.0, filed Mar. 15, 2017, each of which is incorporated herein by reference in its entirety.

TECHNICAL FIELD

The present invention relates to an element wearable on the body, which enables the haptic perception of an acoustic signal.

BACKGROUND

A very wide range of applications are conceivable for such an element. The element may be used to enable deaf and hard-of-hearing people to perceive melodies. Furthermore, the element could be used in a supportive capacity in treatment aimed at relearning to hear. The element could also be used in the field of virtual reality applications, in order to make a virtual reality haptically perceptible for someone wearing the element by generating haptic impressions.

SUMMARY OF THE INVENTION

Embodiments provide an element wearable on the body which enables the haptic perception of an acoustic signal. In various embodiments, the element wearable on the body should preferably be configured such that it can reproduce rapid changes in the frequencies of the acoustic signal with the shortest possible response time.

An element wearable on the body is proposed which has at least one piezoelectric element which is configured to vibrate and in this way generate a haptic impression of an acoustic signal.

Piezoelectric elements are distinguished by a rapid response time and are accordingly suitable for reproducing a rapid sequence of sounds of varying frequency as a haptic signal. In this case, the piezoelectric elements may also be suitable for reproducing melodies as a haptic impression. Mechanical elements, which may likewise be set in vibration, for example, vibrating micro-motors or a membrane, which could be set mechanically or indeed electrically in oscillation, conventionally have a build-up time before they can reach their desired oscillation amplitude. In contrast, the piezoelectric element is distinguished by an extremely short response time.

The piezoelectric element may be suitable for making both the rhythm and the melody of the acoustic signal haptically perceptible. Rhythm is here understood to mean the chronological sequence of sounds making up the acoustic signal. The melody results from the different pitches of the sounds making up the acoustic signal. The piezoelectric element may be configured to reproduce different pitches or frequencies of the acoustic signal haptically through different vibration frequencies of the piezoelectric element. The rhythm may be reproduced by gaps or pauses between the vibrations of the piezoelectric element. Furthermore, the dynamics of the acoustic signal may also be reproduced haptically via the oscillation amplitude of the piezoelectric elements.

An element wearable on the body may here be considered to be any equipment which is suitable for surrounding a body of a person more or less snugly in the form of a synthetic covering. For example, a chest strap is here also considered to be an element wearable on the body.

The element wearable on the body may be arranged and configured to apply a signal to the piezoelectric element which was determined from the acoustic signal by multiplying the frequencies of the acoustic signal with a scaling factor and thereby converting the acoustic signal into a haptically perceptible signal.

Alternatively, the element wearable on the body may be arranged and configured to apply an equivalent signal to the piezoelectric element which was determined from the acoustic signal by determining the equivalent signal from the acoustic signal by means of a transfer function, wherein the shape and intensity of the equivalent signal correlates with the acoustic signal, and the equivalent signal is a haptically perceptible signal. The transfer function may be virtually any desired function which transfers the acoustic signal into an equivalent signal, the shape and intensity of which correlates with the acoustic signal.

The element wearable on the body may have electronics which are configured to multiply the frequencies of the acoustic signal with a scaling factor and thereby to convert the acoustic signal into a haptically perceptible signal. The scaling factor is in this case preferably less than 1, since the haptically perceptible frequencies are smaller than the frequencies of the acoustically perceptible frequency spectrum.

Through multiplication of the acoustic signal with a fixed scaling factor, the acoustic signal may be converted into a haptically perceptible signal in such a way that differences remain between high sounds and low sounds. For example, a first sound of the acoustic signal, which is higher than a second sound of the acoustic signal, may correspond to a first sound of the haptically perceptible signal, which is likewise higher than a second sound of the haptically perceptible signal, which in turn corresponds to the second sound of the acoustic signal.

The electronics may be configured to apply an AC voltage with the frequency of the haptically perceptible signal to the at least one piezoelectric element. Accordingly, the piezoelectric element may be excited to oscillate at the respective frequency. In particular, the electronics are configured to apply AC voltages of various frequencies to the piezoelectric element.

The electronics may be integrated into the element wearable on the body. Alternatively, the element wearable on the body may be connectable with an external device, into which the electronics are integrated. The external device may, for example, be a mobile telephone, a watch or an external drive circuit.

In the context of signal processing, the electronics may be capable of generating the haptically perceptible signal from the acoustic signal.

The acoustic signal may be a recorded audio signal. The element wearable on the body or the electronics may have a memory in which the recorded audio signal is stored.

The acoustic signal may originate from an external noise source transmitting in real time. The element wearable on the body or the electronics may have a microphone, which is configured to pick up the acoustic signal from the external noise source.

The piezoelectric element may be configured to vibrate with amplitudes of different magnitudes and thereby haptically reproduce different volumes of the acoustic signal. A strong vibration may accordingly be associated with a loud signal by a wearer of the element wearable on the body. A weak vibration may be associated with a quiet signal by a wearer of the element wearable on the body.

The at least one piezoelectric element may be configured to vibrate at different frequencies. The piezoelectric element is preferably configured such that the frequencies at which the piezoelectric element vibrates in order to generate a haptic impression are a long way from a resonant frequency of the piezoelectric element. Consequently, resonant effects are not able to arise which would change the vibration amplitude as a function of frequency. If the piezoelectric element is configured to vibrate at different frequencies, different frequencies of the acoustic signal may be haptically reproduced for a wearer of the element wearable on the body.

The element wearable on the body may have a memory in which the acoustic signal is stored. The haptic signal corresponding to the acoustic signal may moreover be stored in the memory, such that said signal does not have to be recalculated. A plurality of acoustic signals and optionally the associated haptic signals may be stored in the memory. Signals stored in a memory may, for example, be used in the course of treatment aimed at relearning to hear. In this case, the haptic signals may be presented to a user once or repeatedly.

Alternatively or in addition, the element wearable on the body may have a microphone which is configured to pick up the acoustic signal. Accordingly, an acoustic signal which currently arises in the immediate vicinity of the element wearable on the body may be made suitable for a wearer of the element wearable on the body to experience it haptically. Such an element wearable on the body is conceivable in particular for the haptic reproduction of music. It could, for example, be worn during a concert.

The at least one piezoelectric element may have a main body and an amplification unit. Internal electrodes and piezoelectric layers may be stacked alternately on one another in a stack direction in the main body. The amplification unit may be arranged on a top of the main body. The amplification unit may be configured to transform a change in length of the main body in a direction perpendicular to the stack direction into a change in length of the amplification unit in the stack direction. In particular, the amplification unit may be configured to amplify a vibration of the main body and in particular to increase the amplitude of the vibration. The amplification unit may be fastened to the main body in such a way that it amplifies an oscillation amplitude of the main body. To this end, the amplification unit may, for example, have a frustoconical metal sheet. The metal sheet may, for example, consist of titanium. The amplification unit may be a purely mechanical element. Accordingly, the amplification unit may also be designated a mechanical amplification unit.

The element wearable on the body may have a plurality of piezoelectric elements which are in each case configured to vibrate and in this way to generate a haptic impression of an acoustic signal. Each of these piezoelectric elements may in this respect be driven by the electronics. Each of these piezoelectric elements may be configured to vibrate at different frequencies, at different chronological intervals and at different amplitudes in order in this way to reproduce different audio frequencies, rhythms and volumes.

The element wearable on the body may, for example, be a garment or an accessory. The garment may be a T-shirt, a sock, a suit for a VR application, a diving suit, a flying suit or a tracksuit. The accessory may, for example, be a ring, a watch, a piece of jewelry, a healing aid, a belt, headphones, spectacles, a stick-on element, such as, for example, a patch or an electrode of a medical device, a glove, a chest strap or a cuff. The piezoelectric element is preferably arranged at a position on the element wearable on the body at which it lies against a haptically particularly sensitive point on the wearer. The fingertips are particularly sensitive to haptic signals, for example. The solar plexus is particularly sensitive to low frequency signals.

The piezoelectric element may be a ceramic actuator, an actuator having a piezo-active polymer material or an actuator having a piezo-resistive polymer material. The piezoelectric element may have a piezoelectrically active material which is woven into the element wearable on the body.

According to a further aspect, the embodiments of the present invention relates to use of the element wearable on the body to make music haptically perceptible.

Advantageous aspects are described below. To simplify referencing, the aspects are consecutively numbered. Features of the aspects are not only relevant when combined with the specific aspect to which they refer, but also when considered separately.

1. Garment having at least one piezoelectric element which is configured to vibrate and in this way to generate a haptic impression of an acoustic signal.

2. Garment according to aspect 1, wherein the garment has electronics which are configured to multiply the frequencies of the acoustic signal with a scaling factor and thereby to convert the acoustic signal into a haptically perceptible signal.

3. Garment according to the preceding aspect, wherein the electronics are configured to apply an AC voltage with the frequency of the haptically perceptible signal to the at least one piezoelectric element.

4. Garment according to one of the preceding aspects, wherein the piezoelectric element is configured to vibrate at amplitudes of different magnitudes and thereby haptically reproduce different volumes of the acoustic signal.

5. Garment according to one of the preceding aspects, wherein the at least one piezoelectric element is configured to vibrate at different frequencies.

6. Garment according to one of the preceding aspects, wherein the garment has a memory in which the acoustic signal is stored, and/or wherein the garment has a microphone which is configured to pick up the acoustic signal.

7. Garment according to one of the preceding aspects, wherein the at least one piezoelectric element has a main body in which internal electrodes and piezoelectric layers are stacked alternately on one another in a stack direction in the main body, and has an amplification unit, wherein the amplification unit is arranged on a top of the main body and is configured to transform a change in length of the main body in a direction perpendicular to the stack direction into a change in length of the amplification unit in the stack direction.

8. Garment according to the preceding aspect, wherein the amplification unit has a frustoconical metal sheet.

9. Garment according to one of the preceding aspects, wherein the garment has a plurality of piezoelectric elements which are each configured to vibrate and in this way to generate a haptic impression of an acoustic signal.

10. Garment according to one of the preceding aspects, wherein the garment is a glove, a chest strap, a T-shirt or a sock.

11. Use of a garment according to one of the preceding aspects to make music haptically perceptible.

BRIEF DESCRIPTION OF THE DRAWINGS

The present invention is described further below with reference to the figures.

DETAILED DESCRIPTION OF ILLUSTRATIVE EMBODIMENTS

Figure 1:
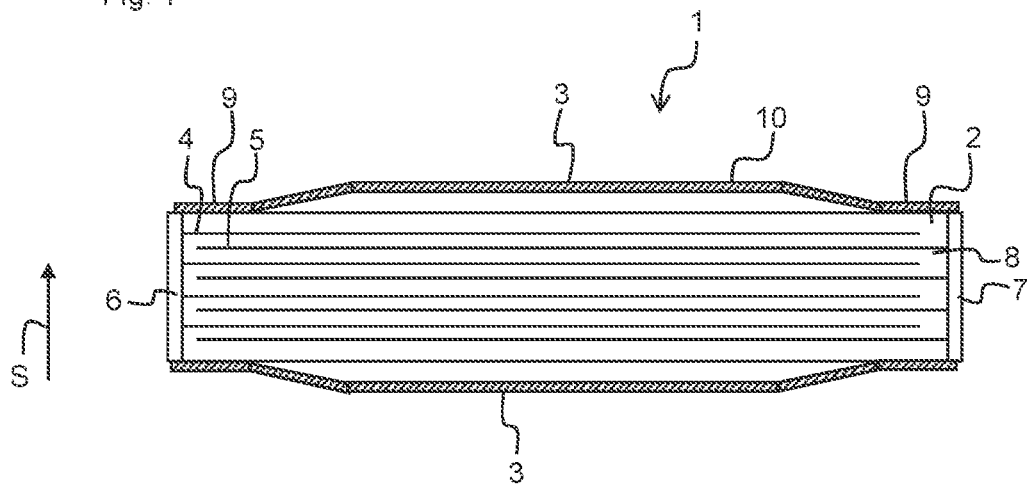
FIG. 1 is a cross-sectional view of a piezoelectric element.

FIG. 1 is a cross-sectional view of a piezoelectric element 1 which may be used in an element wearable on the body to generate a haptic impression.

The piezoelectric element 1 has a main body 2 and a mechanical amplification unit 3. The main body 2 has first internal electrodes 4 and second internal electrodes 5 stacked alternately one above the other in a stack direction S. The internal electrodes 4, 5 may consist of copper. Furthermore, the main body 2 has a first external electrode 6, which is electrically connected with the first internal electrodes 4. The main body 2 furthermore has a second external electrode 7, wherein the second internal electrodes 5 are electrically contacted with the second external electrode 7. The first external electrode 6 and the second external electrode 7 are arranged on mutually opposing side faces of the main body, wherein the surface normals of the side faces are each perpendicular to the stack direction S.

The main body additionally has piezoelectric layers 8, wherein one piezoelectric layer 8 is arranged between every two internal electrodes 4, 5. The piezoelectric layers 8 may consist of a lead-zirconate-titanate ceramic (PZT ceramic). The piezoelectric layers 8 are polarized in the stack direction S. The main body 2 is configured to undergo a change in length in a direction perpendicular to the stack direction S as a result of a voltage applied between the internal electrodes 4, 5. In this respect, use is made of the piezoelectric d31 effect.

The main body 2 has a flat, cuboidal design. It may have a square base area with dimensions in a range between 0.2 cm×0.2 cm and 2.0 cm×2.0 cm and a height between 0.2 mm and 1 mm. The height here indicates the extent of the main body 2 in the stack direction S. The surface normal of the base area points in the stack direction S.

The mechanical amplification unit 3 is arranged directly on a top of the main body 2. The mechanical amplification unit 3 has a metal sheet of titanium. The metal sheet is substantially frustoconical in shape. The metal sheet is configured to transform a change in length of the main body 2 in a direction perpendicular to the stack direction S into a change in length of the amplification unit 3 in the stack direction S.

The amplification unit 3 has a peripheral region 9 which is fastened to the top of the main body 2. The amplification unit 3 additionally has a central region 10 which adjoins the peripheral region 9 and which may move relative to the peripheral region 9. The amplification unit is shaped in such a way that contraction or pulling apart of the peripheral region 9 results in considerable raising or lowering of the central region 10. The distance between the central region 10 and the top of the main body 2 may change in the process. If, therefore, the main body 2 undergoes a transverse contraction as a result of a voltage applied between the internal electrodes 4, 5, this is converted by the mechanical amplification unit 3 into an oscillation of increased amplitude in the stack direction S.

A second amplification unit 3 is arranged on a bottom of the main body 2 opposite the top of the main body. The second amplification unit 3 is of exactly the same construction as the above-described amplification unit 3.

In an alternative embodiment, the piezoelectric element 1 could be configured without the mechanical amplification units 3. In this case, the mechanical oscillations of the piezoelectric element 1 would not be amplified by the amplification units 3, but could nevertheless have an amplitude which is sufficient to generate a haptically perceptible impression.

Figure 2:
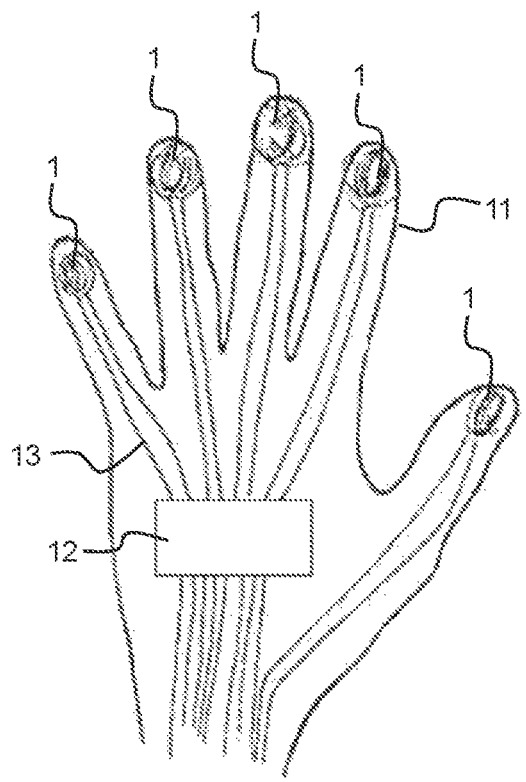
FIG. 2 shows a first exemplary embodiment of a garment.

FIG. 2 shows a first exemplary embodiment of an element 11 wearable on the body having the piezoelectric element 1 shown in FIG. 1. The element 11 wearable on the body comprises a garment, in particular a glove. The glove has five piezoelectric elements 1. Each of the piezoelectric elements 1 is arranged on a fingertip of the glove. The element 11 wearable on the body further comprises electronics 12 which are connected with each of the piezoelectric elements 1 by means of wiring 13.

The electronics 12 are configured to drive the piezoelectric elements 1 and in particular to apply a voltage between the internal electrodes 4, 5. Vibration of the piezoelectric elements 1 is thereby triggered. This vibration may be perceived by a wearer of the element 11 wearable on the body as a haptic impression. By arranging the five piezoelectric elements 1 in each case at a fingertip, a different haptic impression may be generated at each of a wearer's fingers.

The element 11 wearable on the body is configured to generate a haptic impression of an acoustic signal. In this case, the electronics 12 are configured to multiply the frequencies of the acoustic signal with a scaling factor and to convert the acoustic signal in this way into a frequency spectrum which is haptically perceptible. Haptically perceptible frequencies lie below acoustically perceptible frequencies in the frequency spectrum.

The electronics 12 may be configured to make the piezoelectric elements 1 oscillate at different frequencies and different amplitudes. The different frequencies make it possible to make different pitches and thus melodies haptically perceptible to a wearer of the element 11 wearable on the body. The different amplitudes make it possible to reproduce different volumes of the acoustic signal haptically.

Figure 3:
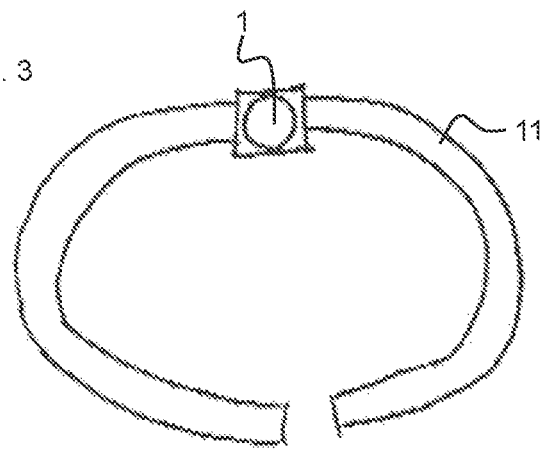
FIG. 3 shows a second exemplary embodiment of a garment.

FIG. 3 shows a second exemplary embodiment of a garment having the piezoelectric element 1 shown in FIG. 1. The garment comprises a chest strap. The chest strap has a single piezoelectric element 1. The piezoelectric element 1 is arranged in such a way on the garment that it lies at the level of the solar plexus of a wearer of the garment. The garment may be particularly well suited to making deep bass sounds haptically perceptible. Such sounds may in particular be perceived haptically via the solar plexus. Although low acoustic signal frequencies may be perceived haptically even without such a garment, a certain minimum volume is then required which might be felt as unpleasant by third parties. The garment in this case makes it possible to convert the acoustic signal noiselessly into a haptic impression.

Figure 4:
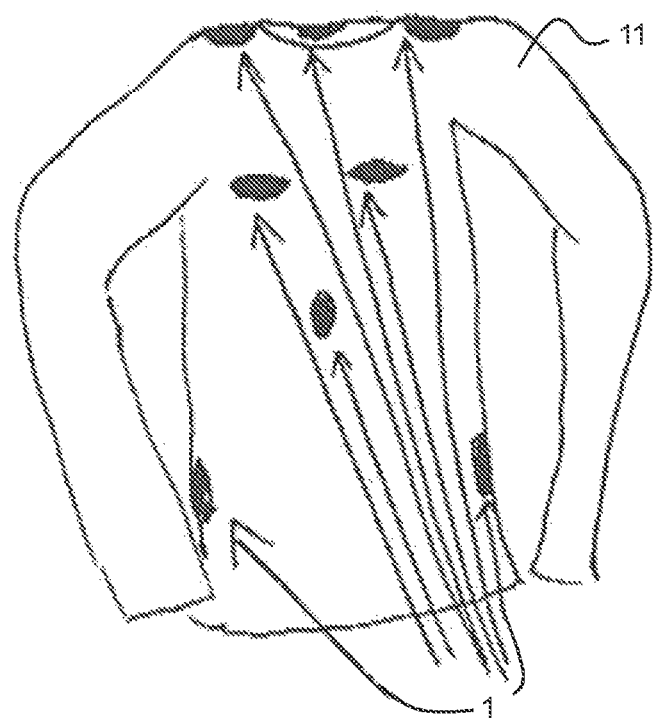
FIG. 4 shows a third exemplary embodiment of a garment.

FIG. 4 shows a third exemplary embodiment of a garment with a piezoelectric element 1 from FIG. 1. The garment comprises a T-shirt. Eight piezoelectric elements 1 are fastened to the garment at different positions. Each of these piezoelectric elements 1 may be driven by electronics 12.

The piezoelectric element 1 shown in FIG. 1 may be used in any desired garment or any desired accessory. For example, a sock is also possible, into which the piezoelectric element 1 shown in FIG. 1 is woven. This could in particular be arranged on the bottom of a sock wearer's foot, since the bottom of the foot is particularly sensitive to haptic impressions.

The invention claimed is:

1. A wearable element comprising:
at least one piezoelectric element configured to vibrate so that a haptic impression of an acoustic signal is generated,
wherein the wearable element is configured to apply a haptically perceptible signal to the at least one piezoelectric element,
wherein the haptically perceptible signal is determined from the acoustic signal by multiplying frequencies of the acoustic signal with a scaling factor and thereby converting the acoustic signal into the haptically perceptible signal,
wherein the scaling factor is less than 1, and
wherein the wearable element is wearable on a body.

2. The wearable element according to claim 1, wherein the wearable element is configured to apply an equivalent signal to the at least one piezoelectric element which was determined from the acoustic signal by determining the equivalent signal from the acoustic signal by a transfer function, wherein a shape and an intensity of the equivalent signal correlates with the acoustic signal, and wherein the equivalent signal is the haptically perceptible signal.

3. The wearable element according to claim 2, wherein electronics are configured to apply an AC voltage with a frequency of the haptically perceptible signal or of the equivalent signal to the at least one piezoelectric element.

4. The wearable element according to claim 3,
wherein the electronics are incorporated into the wearable element, or
wherein the wearable element is connectable with an external device into which the electronics are integrated.

5. The wearable element according to claim 4, wherein, in context of signal processing, the electronics are capable of generating the haptically perceptible signal or the equivalent signal from the acoustic signal.

6. The wearable element according to claim 3, wherein the wearable element or the electronics has a memory in which a recorded audio signal is stored.

7. The wearable element according to claim 3, wherein the wearable element or the electronics has a microphone configured to detect the acoustic signal from an external noise source.

8. The wearable element according to claim 1, wherein the acoustic signal is a recorded audio signal.

9. The wearable element according to claim 1, wherein the at least one piezoelectric element is configured to vibrate at amplitudes of different magnitudes and thereby haptically reproduce different volumes of the acoustic signal.

10. The wearable element according to claim 1, wherein the acoustic signal originates from an external noise source transmitting in real time.

11. The wearable element according to claim 1, wherein the at least one piezoelectric element is configured to vibrate at different frequencies.

12. The wearable element according to claim 1, wherein the at least one piezoelectric element comprises:
a main body in which internal electrodes and piezoelectric layers are stacked alternately on one another in a stack direction, and
an amplification unit arranged on a top of the main body and configured to transform a change in length of the main body in a direction perpendicular to the stack direction into a change in length of the amplification unit in the stack direction.

13. The wearable element according to claim 12, wherein the amplification unit comprises a frustoconical metal sheet.

14. The wearable element according to claim 1, wherein the wearable element has a plurality of piezoelectric elements, each piezoelectronic element configured to vibrate so that a haptic impression of an acoustic signal is generated.

15. The wearable element according to claim 1, wherein the wearable element is an accessory.

16. The wearable element according to claim 1, wherein the wearable element is a garment.

17. The wearable element according to claim 1, wherein the piezoelectric element is a ceramic actuator, an actuator having a piezo-active polymer material or an actuator having a piezo-resistive polymer material.

18. The wearable element according to claim 1, wherein the piezoelectric element has a piezoelectrically active material which is woven into the wearable element.

19. The wearable element according to claim 1, wherein the wearable element has a memory in which a haptic signal corresponding to an acoustic signal is stored.

20. A method for using a wearable element according to claim 1, the method comprising:
making haptically perceptible music with the wearable element.

21. A wearable element comprising:
at least one piezoelectric element configured to:
receive a haptically perceptible signal to the at least one piezoelectric element; and
vibrate so that a haptic impression of an acoustic signal is generated,
wherein the haptically perceptible signal is determined from an acoustic signal by multiplying frequencies of the acoustic signal with a scaling factor and thereby converting the acoustic signal into the haptically perceptible signal,
wherein the scaling factor is less than 1, and
wherein the wearable element is wearable on a body.

* * * * *